(12) United States Patent
Wang et al.

(10) Patent No.: US 8,124,494 B2
(45) Date of Patent: Feb. 28, 2012

(54) METHOD FOR RESHAPING SILICON SURFACES WITH SHALLOW TRENCH ISOLATION

(75) Inventors: Yu-Hsiung Wang, Hsinchu (TW); Wen-Ting Chu, Kaohsiung (TW); Eric Chen, Hsinchu (TW); Hsien-Wei Chin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 479 days.

(21) Appl. No.: 11/778,558

(22) Filed: Jul. 16, 2007

(65) Prior Publication Data

US 2009/0023255 A1 Jan. 22, 2009

Related U.S. Application Data

(60) Provisional application No. 60/848,289, filed on Sep. 29, 2006.

(51) Int. Cl.
*H01L 21/76* (2006.01)

(52) U.S. Cl. ........ 438/400; 438/242; 438/431; 438/770; 257/E21.301; 257/E21.55

(58) Field of Classification Search .................. 438/400, 438/431, 242, 452, 770; 257/E21.301, E21.55
See application file for complete search history.

(56) References Cited

U.S. PATENT DOCUMENTS

| | | | |
|---|---|---|---|
| 6,380,103 B2 * | 4/2002 | Gonzalez et al. | 438/774 |
| 6,417,037 B1 * | 7/2002 | Feng | 438/216 |
| 6,576,949 B1 * | 6/2003 | Park | 257/314 |
| 6,818,526 B2 * | 11/2004 | Mehrad et al. | 438/424 |
| 2003/0176043 A1 * | 9/2003 | Kim et al. | 438/424 |
| 2004/0172592 A1 | 9/2004 | Collie et al. | |
| 2004/0225583 A1 | 11/2004 | Joodi | |
| 2005/0187969 A1 | 8/2005 | Chaudri | |

\* cited by examiner

*Primary Examiner* — Julia Slutsker

(74) *Attorney, Agent, or Firm* — Slater & Matsil, L.L.P.

(57) ABSTRACT

A method for making a semiconductor device by reshaping a silicon surface with a sacrificial layer is presented. In the present invention the steps of forming a sacrificial dielectric layer and removing the sacrificial dielectric layer are repeated multiple times in order to remove sharp edges from the silicon surface near the field oxides. Another aspect of the present invention includes making a MOSFET transistor that incorporates the forming and removing of multiple sacrificial layers into the process.

20 Claims, 7 Drawing Sheets

METHOD FOR RESHAPING SILICON SURFACES WITH SHALLOW TRENCH ISOLATION

CROSS REFERENCE TO RELATED PROVISIONAL APPLICATION

This application claims the benefit of U.S. Provisional Application No. 60/848,289, filed on Sep. 29, 2006, entitled "Method for Reshaping Silicon Surfaces with Shallow Trench Isolation."

TECHNICAL FIELD

The present invention relates generally to methods of forming semiconductor devices, and more specifically, to forming silicon surfaces with shallow trench isolation.

BACKGROUND

The attempt to reduce the size of semiconductor devices built on a silicon-type substrate is ever constant. However, as the size of semiconductor devices are reduced, many problems, whose effects were insignificant in larger devices, can become critical to the efficient operation of the device. One such problem is an area of thin material in a dielectric that is formed over a silicon substrate near an isolation region.

FIG. 1 shows this problem where a substrate 101, an isolation region 103, and a gate dielectric 105 come together. As illustrated, a sharp corner or spike, indicated in FIG. 1 by a dotted circle 107, occurs at the edge of the silicon substrate 101 next to the isolation region 103 (usually a shallow trench isolation (STI)). When a subsequent gate dielectric 105 is formed over the substrate 101, this sharp corner effectively causes the dielectric layer 105 to be thinner over the spike than other areas of the dielectric layer 105. This thinner area can result in many problems as devices are reduced in size.

Illustrative examples of these problems include a parasitic transistor, which, in the prior art, can appear as a double hump behavior in a drain current-gate voltage characterization. Another of these problems is that the STI thin corner will allow a punch-through disturb for non-volatile technologies such as flash devices. Finally, this thin corner can also cause a leaky path for logic technologies.

FIGS. 2A and 2B illustrate a technique that, while it was not designed to help with these problems, may help to slightly mitigate them: a sacrificial dielectric layer 205. FIG. 2A illustrates a structure comprising a substrate 101 that has STIs 103 formed within it. FIG. 2B illustrates a sacrificial layer 205 being formed over the substrate 101 and also over portions of the STIs 103. The sacrificial layer 205 is subsequently removed from the substrate 101 and the STIs 103 through an etching process.

While the sacrificial layer 205 is meant to be used as either a screening layer for a subsequent implantation or to remove surface defects from the surface of the substrate 101, FIG. 3 illustrates the effect of the sacrificial layer 205 and its subsequent etching removal on the sharp edges around the STIs 103. As illustrated, the process works to blunt the sharp edge of the substrate 101, and accordingly, to slightly increase the thickness of the dielectric layer 105. However, this unintentional side effect of the formation and subsequent removal of the sacrificial layer 205 cannot, by itself, blunt the edge of the substrate 101 enough to overcome the potential problems with parasitic transistors, leakage, and disturb problems that could come from these areas.

Because of these and other problems associated with the current methods of manufacturing, a new method of reshaping a silicon surface is needed.

SUMMARY OF THE INVENTION

These and other problems are generally solved or circumvented, and technical advantages are generally achieved, by preferred embodiments of the present invention that allow for a method to reshape silicon surfaces using multiple sacrificial layers.

One aspect of the present invention includes a method of manufacturing a semiconductor device that comprises an initial step of providing a substrate that has isolation regions formed therein. A dielectric layer is formed on the substrate and on a portion of the isolation regions. The dielectric layer is subsequently removed from the substrate and the portion of the isolation regions. The formation and removal of this dielectric layer are repeated one or more times.

Another aspect of the present invention includes a similar initial substrate and isolation regions. A plurality of steps is then performed, wherein each step comprises forming a dielectric layer and subsequently removing the dielectric layer from the substrate and a portion of the isolation regions.

Yet another aspect of the present invention includes a method of manufacturing a semiconductor device comprising the same initial first step of providing a substrate with isolation regions already formed therein. A plurality of steps is then performed, wherein each step comprises forming a sacrificial dielectric layer and subsequently removing the sacrificial dielectric layer. Once all of the sacrificial dielectric layers have been formed and removed, a gate dielectric layer, a gate electrode, spacers, and source/drain regions are formed to complete the semiconductor device.

By using these methods to reshape the silicon substrate, the sharp edges of the substrate (and subsequent thinning areas of the gate dielectric) are removed. This helps to prevent parasitic transistors from forming and helps to prevent a leaky path from a MOSFET.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to the formation of a metal-oxide semiconductor field effect transistor. The invention may also be applied, however, to other semiconductor devices, such as capacitors, resistors, other types of transistors, and the like.

Figure 1:
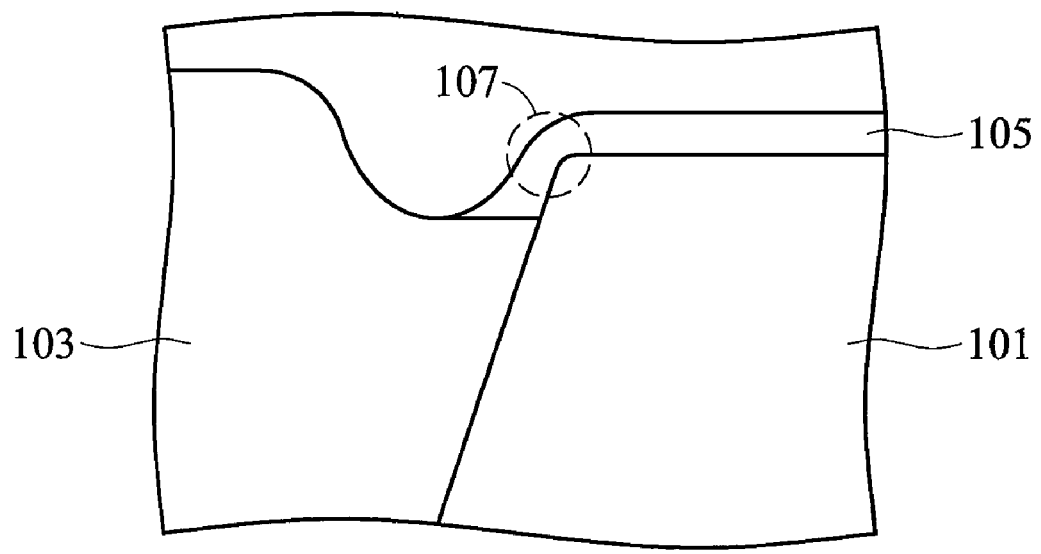
FIG. 1 is a cross-sectional view of a junction between a substrate, a isolation region, and a dielectric layer in the prior art that has not had a sacrificial layer formed and removed.
Figure 2A:
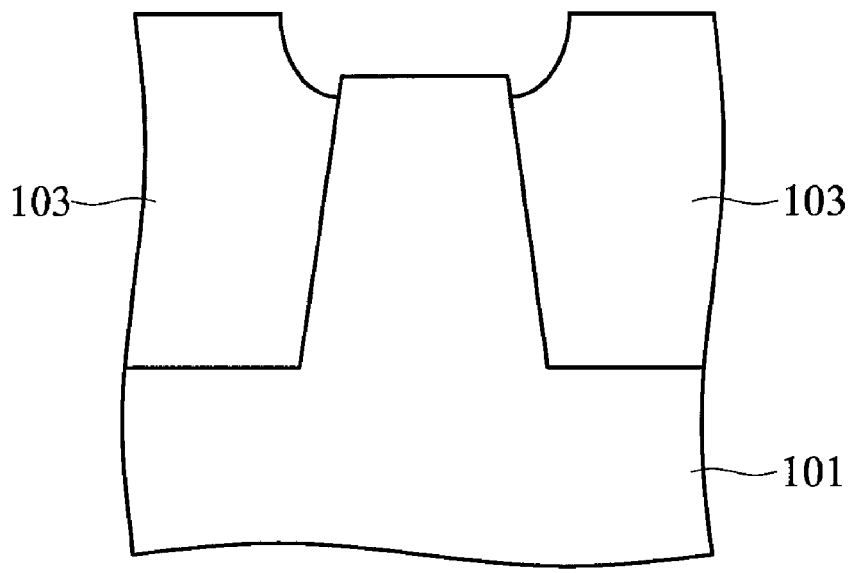
FIGS. 2A-2B are cross-sectional views of steps in the process of forming a sacrificial layer and then removing the sacrificial layer in the prior art.
Figure 2B:
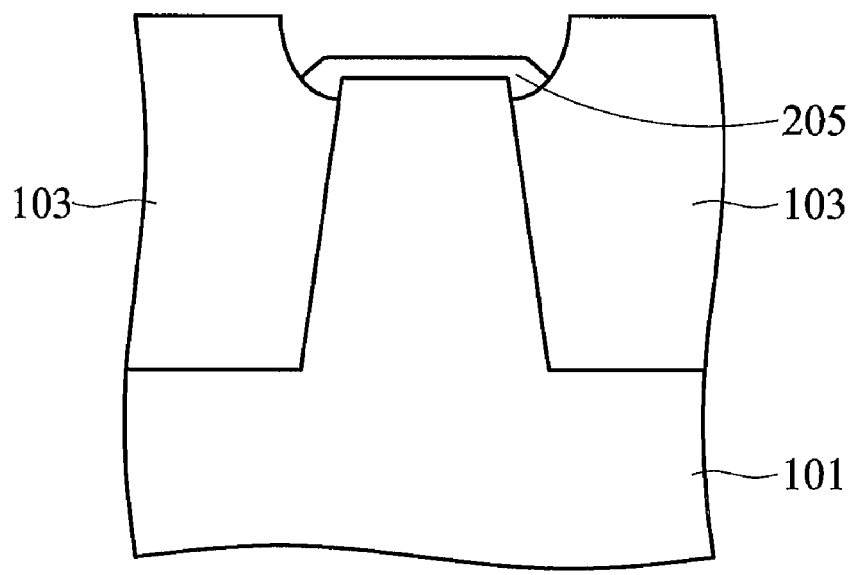
Figure 3:
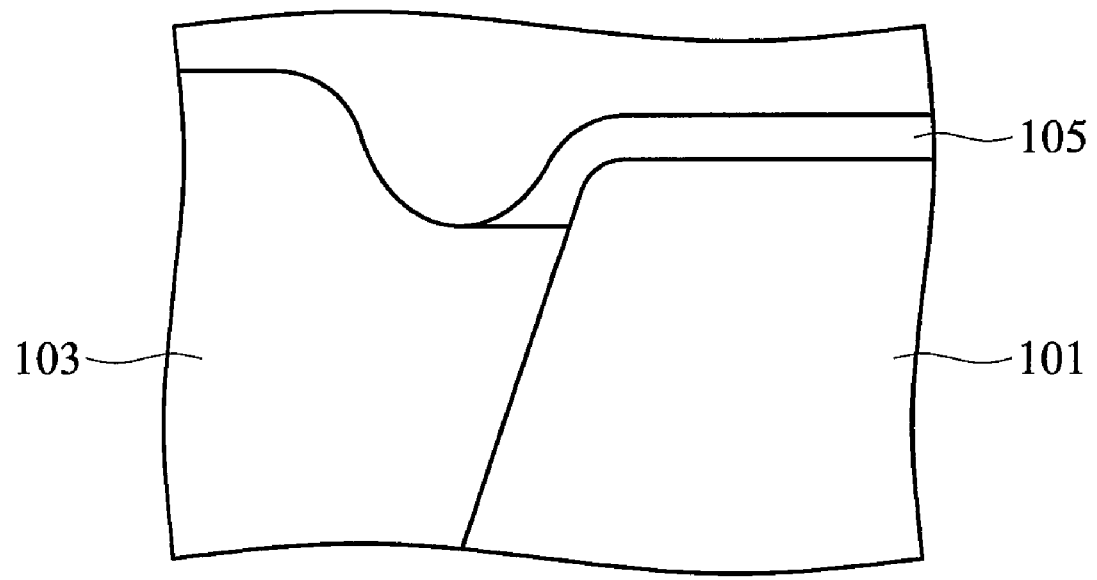
FIG. 3 is a cross-sectional view of a junction between a substrate, an isolation region, and a dielectric layer in the prior art that has had a single sacrificial layer formed and removed.
Figure 4:
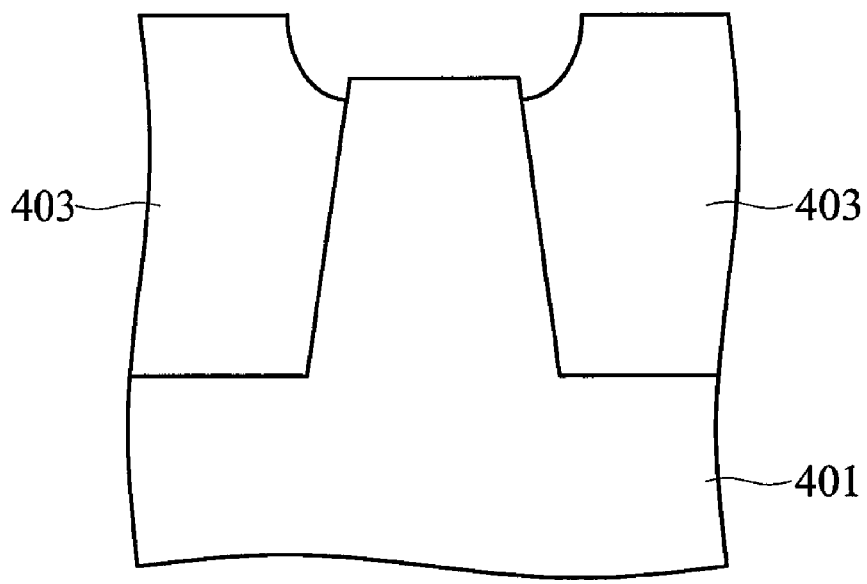
FIG. 4 is a cross-sectional view of a substrate with isolation regions formed therein, in accordance with an embodiment of the present invention.

FIG. 4 illustrates a substrate 401 with isolation regions 403 formed therein. The substrate 401 may comprise bulk silicon, doped or undoped, or an active layer of a silicon on insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Generally, isolation regions 403 act to electrically isolate electronic devices formed on the substrate 401. In an embodiment, the isolation regions 403 are shallow trench isolation structures (STIs) formed by etching the substrate 101 to form a trench and filling the trench with a dielectric material as is known in the art. Preferably, the isolation regions 403 are filled with a dielectric material such as an oxide material, a high-density plasma (HDP) oxide, or the like, formed by methods known in the art. However, other types of isolation structures, such as using local oxidation of silicon (LOCOS) to form field dielectrics, could be used to isolate the substrate 401.

Figure 5:
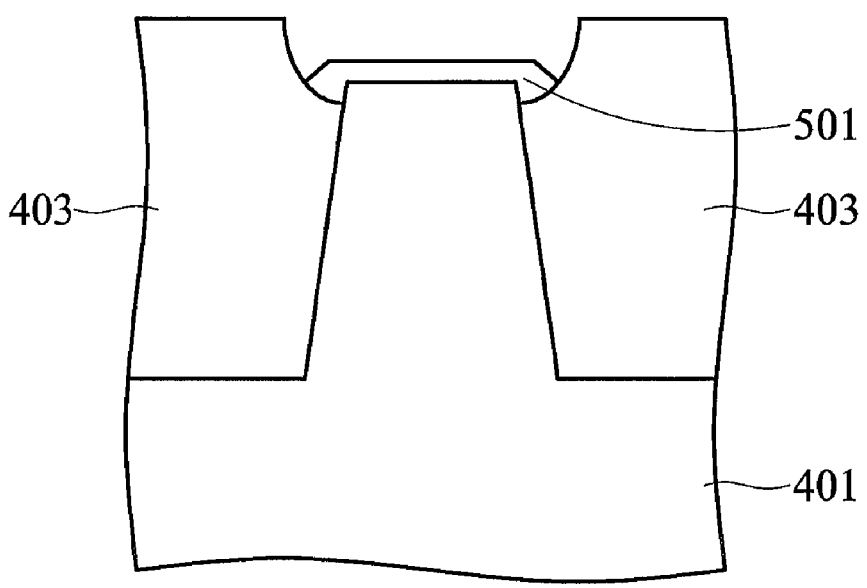
FIG. 5 is a cross-sectional view of the structure of FIG. 4 after a sacrificial layer has been formed thereon, in accordance with an embodiment of the present invention.

FIG. 5 illustrates the formation of a first sacrificial layer 501 over the substrate 401 and over a portion of the isolation regions 403. The sacrificial layer 501 is preferably a silicon oxide formed by silicon oxidation of the upper portions of the substrate 401. Alternatively, the sacrificial layer 501 could be made of silicon nitride formed through a silicon nitridation of the upper portions of the substrate 401. The sacrificial layer 501 may have a thickness of between about 50 Å to about 250 Å, with a preferred thickness of about 150 Å.

Figure 6:
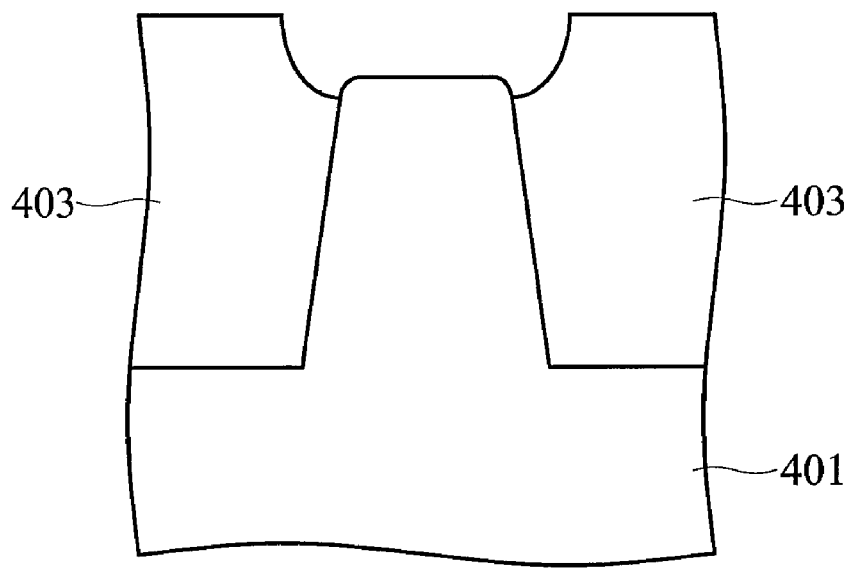
FIG. 6 is a cross-sectional view of the structure of FIG. 5 after the sacrificial layer has been removed from the structure, in accordance with an embodiment of the present invention.

FIG. 6 illustrates the resulting structure after the first sacrificial layer 501 has been removed from the substrate 401 and isolation regions 403. The sacrificial layer 501 may be removed using a wet etch process using such etchants as hydrofluoric acid (HF), ammonium fluoride (NH$_4$F), acetic acid (C$_2$H$_4$O$_2$), nitric acid (HNO$_3$), phosphoric acid (H$_3$O$_4$P), hydrochloric acid (HCl), and the like. However, as one skilled in the art will recognize, many other etchants and processes could be utilized in order to remove the sacrificial layer 501. For example, a dry etch process could be utilized with such etchants as hexaflouropropene (C$_2$HF$_3$), perflourocarbons such as perfluoroeneopentane (C$_5$F$_{12}$), or other chemicals with the formulas C$_x$F$_y$ or C$_x$F$_y$H$_z$. The examples listed above are not meant to limit the present invention to those processes or etchants.

The process as described above in FIGS. 4-6 combine to form one process that comprises the formation and removal of a sacrificial layer 501. As stated above, however, a single process of forming and removing one sacrificial layer 501 does not obtain the benefits required for smaller and smaller devices. Accordingly, the process as described by FIGS. 4-6 is repeated one or more times until the substrate 401 has a stepwise shape, and the desired thickness of a subsequent dielectric layer 701 (whose formation is described below) in the area of the isolation region 403 can be obtained. When the process is repeated, the thickness of each successive sacrificial layer 501 may be different or the same as previous sacrificial layers 501.

The final shape of the substrate 401 is dependent upon the number of times that the steps are repeated. There will be a "step" in the substrate 401 for every time a sacrificial layer 501 has been formed and removed. For example, if two sacrificial layers 501 are formed and removed, there will be two "steps" in the substrate 401, and if three sacrificial layers 501 are formed and removed, there will be three "steps" in the substrate 401. If the process is repeated more than three times, the number of "steps" will equal the number of sacrificial layers 501 that have been used. These "steps" are discussed in more detail below with reference to FIG. 9 and FIG. 10.

In an embodiment wherein the substrate 401 is initially undoped, the implantation stage (doping the substrate 401 with either a p-type or n-type impurity) can be performed after the multiple steps are performed and the edge of the substrate 401 has the desired shape. Alternatively, the implantation may occur either between the plurality of steps after the sacrificial layer 501 has been removed or after the sacrificial layer 501 has been formed, but prior to the sacrificial layer 501 being removed. If the implantation is performed prior to the sacrificial layer 501 being removed, the sacrificial layer 501 may be used as a screening layer for the implantation process.

Figure 7:
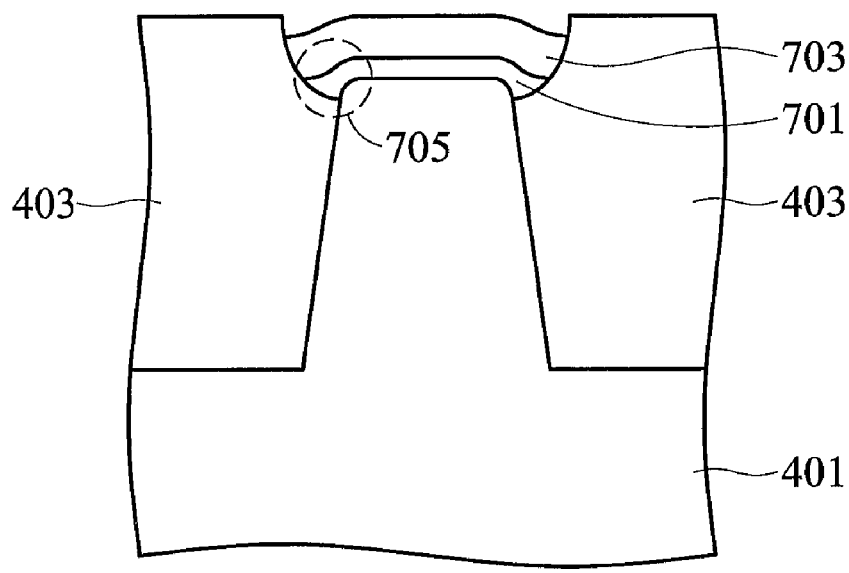
FIG. 7 is a cross-sectional view of the structure of FIG. 6 after a plurality of sacrificial layers have been removed and both a dielectric layer and a gate electrode have been formed over the substrate, in accordance with an embodiment of the present invention.

FIG. 7 illustrates the formation of a dielectric layer 701 and a gate electrode 703 over the substrate 401 once all of the desired sacrificial layers 501 have been formed and removed. One of the junction areas 705 where the substrate 401, the dielectric layer 701, the gate electrode, and the isolation region 403 are connected is indicated by a dotted line. The dielectric layer 701 is preferably a high-K dielectric material, such as silicon oxide, silicon oxynitride, silicon nitride, an oxide, a nitrogen-containing oxide, a combination thereof, or the like. Preferably, the dielectric layer 701 has a relative permittivity value greater than about 4. Other examples of such materials include aluminum oxide, lanthanum oxide, hafnium oxide, zirconium oxide, hafnium oxynitride, or combinations thereof.

In the preferred embodiment in which the dielectric layer 701 comprises an oxide layer, the dielectric layer 701 may be formed by any oxidation process, such as wet or dry thermal oxidation in an ambient comprising an oxide, H$_2$O, NO, or a combination thereof, or by chemical vapor deposition (CVD) techniques using tetra-ethyl-ortho-silicate (TEOS) and oxygen as a precursor. In an embodiment, the dielectric layer 701 is between about 8 Å to about 200 Å in thickness.

The gate electrode 703 preferably comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In the preferred embodiment in which the gate electrode 703 is poly-silicon, the gate electrode 703 may be formed by depositing doped or undoped poly-silicon by low-pressure chemical vapor deposition (LPCVD) to a thickness in the range of about 400 Å to about 2,500 Å, but more preferably about 1,500 Å.

Figure 8:
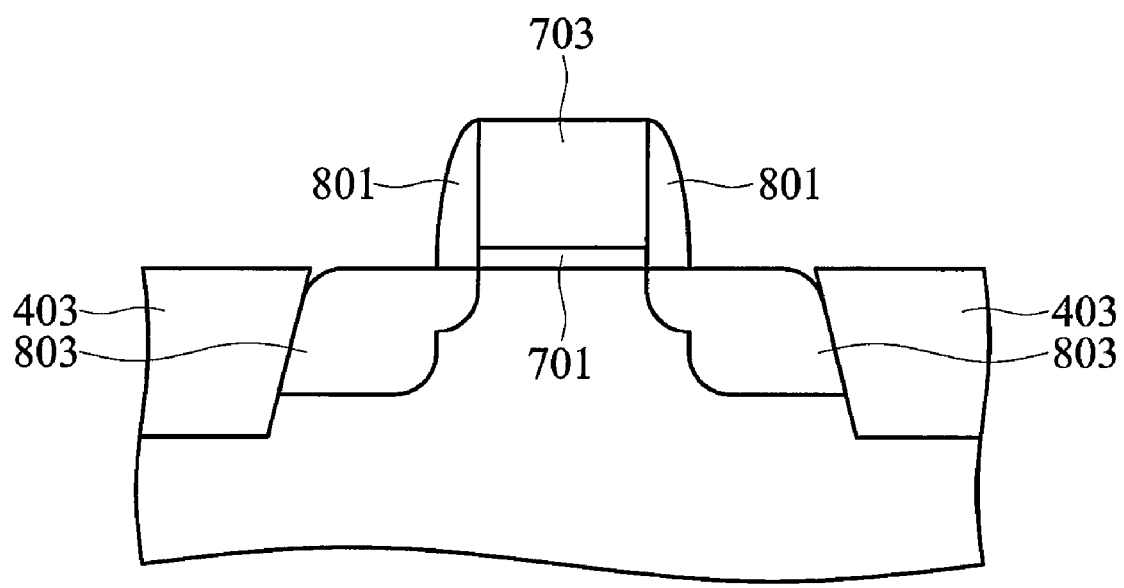
FIG. 8 is a side view of the structure of FIG. 7 after the formation of spacers and source/drain regions, in accordance with an embodiment of the present invention.

FIG. 8 is a cross-sectional side view of the structure shown in FIG. 7 with the additional formations of spacers 801 and source/drain regions 803. To form the spacers 801 a spacer layer (not shown) is typically blanket deposited on the previously formed structure. The spacer layer preferably comprises SiN, oxynitride, SiC, SiON, oxide, and the like and is preferably formed by commonly used methods such as chemical vapor deposition (CVD), plasma enhanced CVD, sputter, and other methods known in the art. The spacers 801 are then patterned, preferably by anisotropically etching and removing the spacer layer from the horizontal surfaces of the structure.

In the preferred embodiment, the source/drain regions 803 are formed by one or more implantations of impurities, such as arsenic or boron, into the substrate 401. The source/drain regions 803 may be formed such that the device is either an NMOS device or a PMOS device. Because the gate electrode 703 and spacers 801 are used as masks, the source/drain regions 803 are substantially aligned with the gate electrode 703 and the respective spacers 801.

It should be noted that, though the above-described process describes a specific process, one of ordinary skill in the art will realize that many other processes, steps, or the like may be used. For example, one of ordinary skill in the art will realize that a plurality of implants may be performed using various combinations of spacers and liners to form source/drain regions 803 having a specific shape or characteristic suitable for a particular purpose. Any of these processes may be used to form the source/drain regions 803, and the above description is not meant to limit the present invention to the steps presented above.

Figure 9:
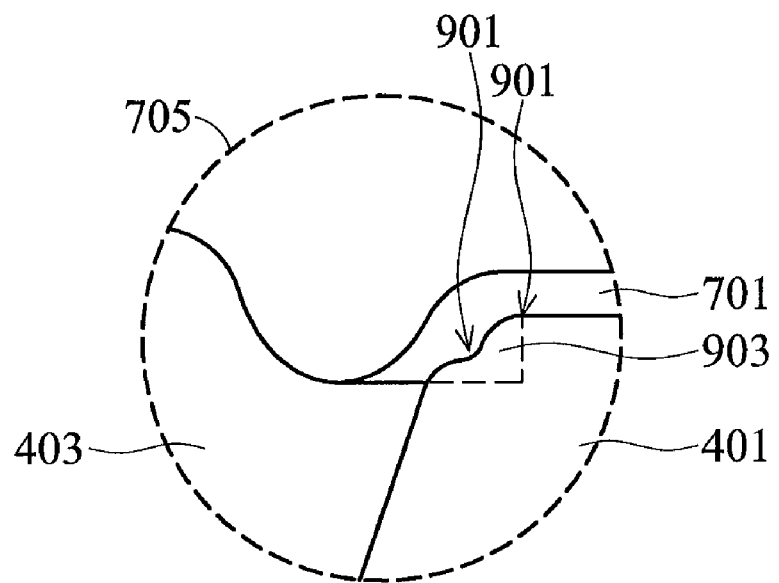
FIG. 9 is a close up cross-sectional view of a junction of the substrate, isolation region, and dielectric layer after two sacrificial layers have been formed and removed, in accordance with an embodiment of the present invention.

FIG. 9 illustrates an enlarged view of a junction area 705 in FIG. 7 after two sacrificial layers 501 (not shown) have been formed and removed from the substrate 401. As shown, the sharp edges of the substrate 401 have been significantly reshaped into two steps 901 in a first region 903 of the substrate 401 that is adjacent to the isolation region 403. The remainder of the substrate 401 remains substantially planar. After two sacrificial layers 501 have been formed and removed, the dielectric layer 701 formed over the substrate 401 in that region is much thicker than if no sacrificial layer 501 had been formed and removed, or if only one sacrificial layer 501 had been formed and removed.

Figure 10:
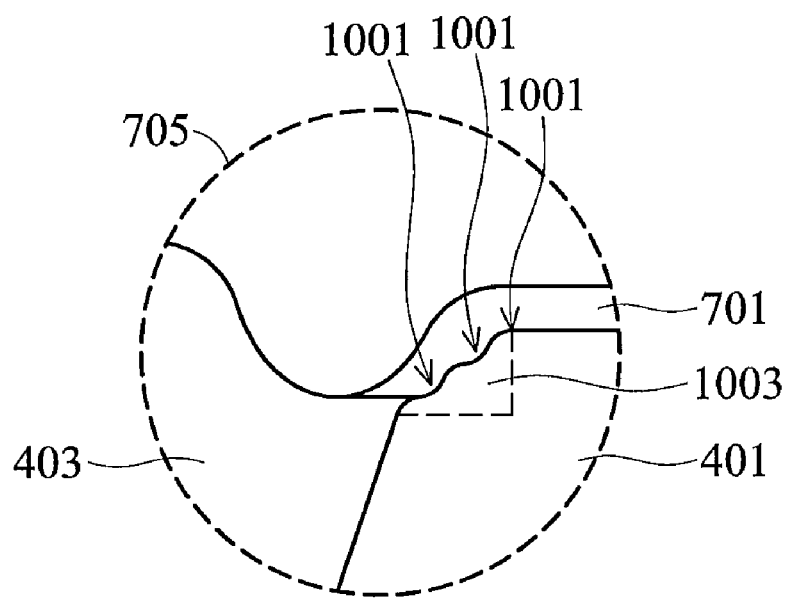
FIG. 10 is a close up cross-sectional view of a junction of the substrate, isolation region, and dielectric layer after three sacrificial layers have been formed and removed, in accordance with an embodiment of the present invention.

FIG. 10 illustrates an enlarged view of a similar junction area 705 after three sacrificial layers 501 (not shown) have been formed and removed from the substrate 401. As shown, there are three "steps" 1001 in a first region 1003 of the substrate 401 near the isolation regions 403. Notably, the substrate 401 is even further removed from the surface of the dielectric layer 701. The more times that this process is repeated, the thicker the dielectric layer 701 over this region of the substrate 401 will eventually be.

As one of ordinary skill in the art will appreciate, in the present invention the region of the substrate 401 below the dielectric layer 701 in the region next to the isolation region 403 can be reshaped by forming and removing multiple sacrificial layers 501. Using this approach, the dielectric layer 701 in this region can become considerably thicker than otherwise. This thicker region can then help to reduce or eliminate the problems associated with parasitic transistors, punch through disturbs for non-volatile technologies, and leaky paths.

Although the present invention and its advantages have been described in detail, it should be understood that various changes, substitutions and alterations can be made herein without departing from the spirit and scope of the invention as defined by the appended claims. For example, there are multiple methods for the deposition of material as the structure is being formed. Any of these deposition methods that achieve substantially the same result as the corresponding embodiments described herein may be utilized according to the present invention.

Moreover, the scope of the present application is not intended to be limited to the particular embodiments of the methods described in the specification. As one of ordinary skill in the art will readily appreciate from the disclosure of the present invention, methods presently existing, or later to be developed, that perform substantially the same function or achieve substantially the same result as the corresponding embodiments described herein may be utilized according to the present invention. Accordingly, the appended claims are intended to include within their scope such methods.

What is claimed is:

1. A method for manufacturing a semiconductor device, the method comprising:
(A) providing a substrate with isolation regions formed therein, wherein sidewalls of the substrate adjacent to the isolation regions are at least partially exposed;
(B) forming a dielectric layer on the substrate and on a portion of the isolation regions, the dielectric layer having a first thickness;
(C) removing the dielectric layer; and
(D) forming at least one indentation in the substrate at a junction of the sidewalls and the isolation regions by repeating steps (B)-(C) one or more times.

2. The method of claim 1, wherein the dielectric layers are formed at least in part by silicon oxidation or silicon nitridation.

3. The method of claim 1, wherein the dielectric layers have a thickness between about 50 Å and about 250 Å.

4. The method of claim 1, wherein the isolation regions are field oxide regions or shallow trench isolations.

5. The method of claim 1, wherein the dielectric layers are removed at least in part by an etching process.

6. The method of claim 1, further comprising:
forming a gate dielectric and gate electrode;
forming spacers; and
forming source/drain regions.

7. A method for manufacturing a semiconductor device, the method comprising:
providing a substrate with isolation regions formed therein, wherein a portion of at least one of the isolation regions is recessed from a surface of the substrate so as to expose a sidewall of the substrate;
forming a stepwise shape in the substrate adjacent to the isolation regions by performing a plurality of steps, each step comprising:

forming a dielectric layer on the substrate and on a portion of the isolation regions, the dielectric layer having a first thickness; and removing the dielectric layer.

8. The method of claim 7, wherein the dielectric layers are formed at least in part by silicon oxidation or silicon nitridation.

9. The method of claim 7, wherein the dielectric layers have a thickness between about 50 Å and about 250 Å.

10. The method of claim 7, wherein the isolation regions are field oxide regions or shallow trench isolations.

11. The method of claim 7, wherein the dielectric layers are removed at least in part by an etching process.

12. The method of claim 7, further comprising:
forming a gate dielectric and gate electrode;
forming spacers; and
forming source/drain regions.

13. The method of claim 7, further comprising implanting impurities into the substrate after the plurality of steps.

14. The method of claim 7, wherein one of the plurality of steps further comprises implanting impurities into the substrate after the forming a dielectric layer.

15. A method of manufacturing a metal-oxide semiconductor field effect transistor, the method comprising:
(A) providing a substrate with isolation regions formed therein, wherein the substrate comprises at least one exposed sidewall adjacent to an isolation region;
(B) forming a dielectric layer on the substrate and on a portion of the isolation regions, the dielectric layer having a first thickness;
(C) removing the dielectric layer;
(D) repeating steps (B)-(C) one or more times to form multiple steps into the substrate at an intersection of the at least one sidewall and the isolation region;
(E) forming a gate dielectric;
(F) forming a gate electrode;
(G) forming spacers; and
(H) forming source/drain regions.

16. The method of claim 15, wherein the dielectric layers are formed at least in part by silicon oxidation or silicon nitridation.

17. The method of claim 15, wherein the dielectric layers have a thickness between about 50 Å and about 250 Å.

18. The method of claim 15, wherein the dielectric layers are removed at least in part by an etching process.

19. The method of claim 15, further comprising implanting impurities into the substrate after the repeating steps (B)-(C) one or more times has been completed.

20. The method of claim 15, wherein one of the repeating steps (B)-(C) one or more times further comprises implanting impurities into the substrate after the forming a dielectric layer.

* * * * *